United States Patent [19]

Bailey

[11] Patent Number: 4,595,959
[45] Date of Patent: Jun. 17, 1986

[54] WIDE BANDWIDTH CONSTANT GAIN PEAK DETECTOR

[75] Inventor: Roger G. Bailey, Lafayette, Colo.

[73] Assignee: Storage Technology Corporation, Louisville, Colo.

[21] Appl. No.: 642,933

[22] Filed: Aug. 21, 1984

[51] Int. Cl.[4] .......................... G11B 5/09; G11B 5/02; H03K 5/153
[52] U.S. Cl. ...................................... 360/67; 307/353; 360/46
[58] Field of Search ............... 307/351, 352, 359, 353; 328/151

[56] References Cited

U.S. PATENT DOCUMENTS 4,352,070  9/1982  Beaducel et al. .................... 307/353
4,520,283  5/1985  Sasaki et al. ......................... 328/151

Primary Examiner—Vincent P. Canney
Attorney, Agent, or Firm—Woodcock Washburn Kurtz Mackiewicz & Norris

[57] ABSTRACT

A peak detector circuit has a first stage and a second stage. The first stage has a short time constant so that the level of the peaks are detected with a high bandwidth. A second stage follows the peaks detected in the first stage. The capacitor in the second stage is rapidly discharged when a new peak is detected by the first stage.

7 Claims, 16 Drawing Figures

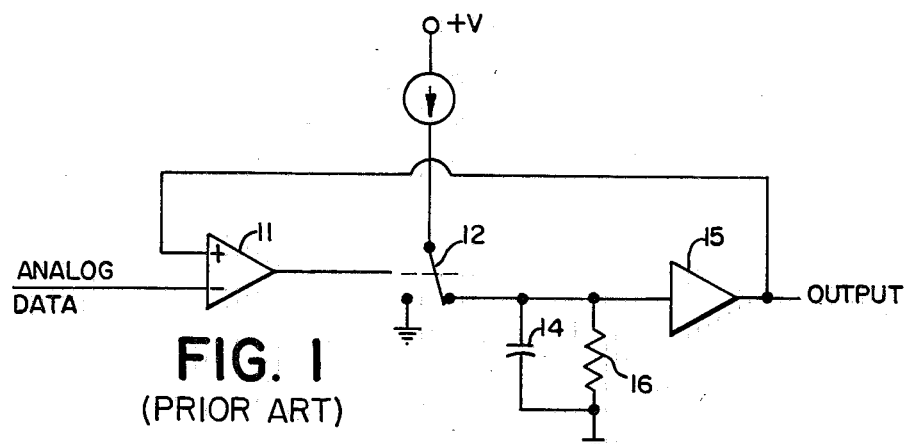
FIG. 1
(PRIOR ART)
FIG. IA
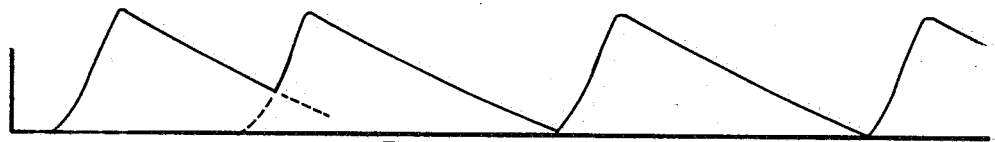
FIG. IB
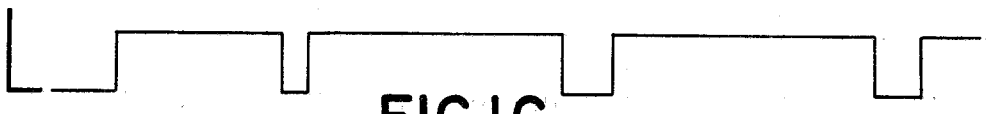
FIG.IC
FIG.ID
FIG. IE

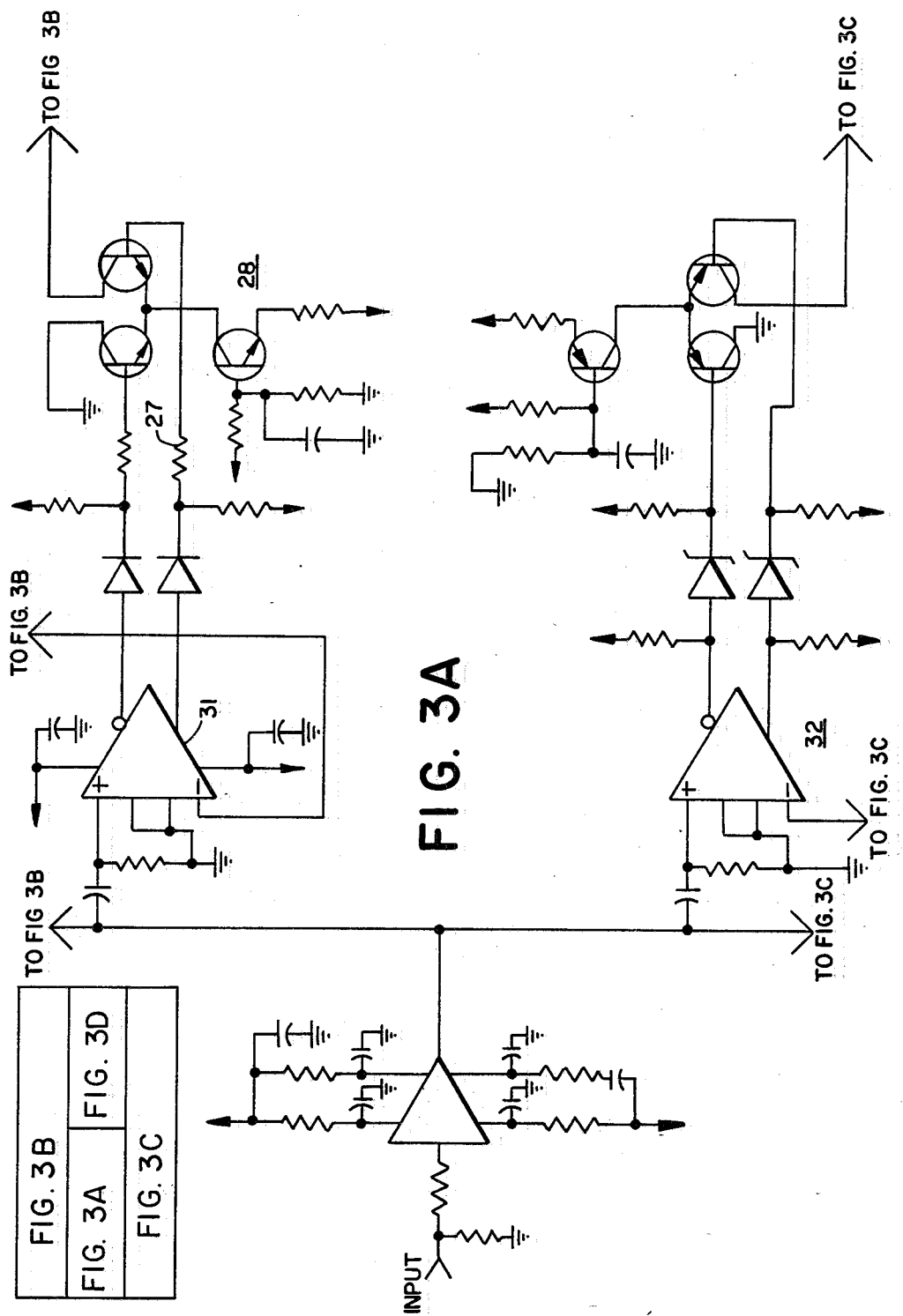

WIDE BANDWIDTH CONSTANT GAIN PEAK DETECTOR

BACKGROUND OF THE INVENTION

This invention relates to peak detector circuits, and more particularly, to a peak detector circuit which has a wide bandwidth and a gain which remains constant with frequency.

Peak detector circuits are widely used, for example, in magnetic disk drives. The read back analog signal from a disk drive head is pulse position modulated. It is desirable to detect the peaks of these pulses to produce a signal which can be used for automatic gain control. The pulse position modulation of the input signal from the disk head is a type of phase or frequency modulation (FM). Any interference which causes phase shift (peak of data pulse shift) degrades the analog signal and introduces timing errors in the resulting decoded data.

An amplitude modulated carrier frequency has no phase error at the carrier zero degrees or 180 degrees points; however, the peak of the AM modulated signal will be displaced from the 90 and 270 degree locations. This peak shift caused by AM modulation applies to an AM modulated FM signal also. Peak shift caused by AM modulation is a source of timing error in a disk drive. AM modulation on the disk head read back analog signal is caused by mechanical structural vibrations which can be minimized but not eliminated.

A wide bandwidth, constant gain, peak detector is desirable for use in an automatic gain control (AGC) loop to remove AM modulation from the data.

When the ratio of the conventional peak detector bandwidth divided by the carrier frequency is a high percentage number (large relatively bandwidth) the peak detector gain changes when the carrier frequency changes. The gain change versus carrier frequency change is proportional to relative bandwidth of the conventional peak detector.

Prior art peak detectors have a trade off of bandwidth versus FM to AM conversion. The larger the relative bandwidth, the greater the FM to AM conversion. It is undesirable to have the change in carrier frequency (FM) cause a peak detector output amplitude variation (AM). This FM to AM conversion by a peak detector causes an error in the extracted AM modulation.

It is an object of the present invention to provide a peak detector circuit having a gain which remains relatively constant regardless of the frequency or the run length of the pulses in the input signal.

SUMMARY OF THE INVENTION

In accordance with the present invention, a peak detector circuit includes a first stage with a capacitor which is charged to the peak input voltage as detected by a comparator and discharged through a discharge path with a relatively short time constant. The first stage closely follows changes in the pulse peaks in the input signal; the first stage has a wide bandwidth. In accordance with the invention, a second stage includes a comparator, capacitor, and discharge circuit which follows the peaks detected in the first stage. The second stage has a long time constant so that the output is not sensitive to changes in the frequency or run length of the pulses. The second capacitor is discharged rapidly when the first stage detects a new peak in the input signal. After the rapid discharge of the second stage capacitor, the new peak value is applied and held by the second stage capacitor. This produces a non-varying output between peaks which keeps the peak detector at a constant output versus carrier frequency. Stated another way, the peak detector gain does not change appreciably with a change in carrier frequency.

The peak detector of the present invention can extract a relatively wide bandwidth AM modulation from a carrier that is FM modulated with greatly reduced FM to AM conversion. This superior performance versus the conventional peak detector makes the invention useful for AM demodulation in critical areas such as wide bandwidth AGC loops and critical signal processing channels.

The foregoing and other objects, features and advantages of the invention will be better understood from the following more detailed description and appended claims.

SHORT DESCRIPTION OF THE DRAWINGS

FIG. 1 depicts a prior art peak detector;

FIGS. 1A–1D are waveforms depicting the operation of FIG. 1 and more specifically;

FIG. 1A shows the input signal;

FIG. 1B shows the voltage on the capacitor and the output of the buffer;

FIG. 1C shows the output of the comparator;

FIG. 1D shows the average DC output;

FIG. 1E shows e timing diagram;

FIGS. 2A–2F are waveforms depicting the operation of FIG. 2 and more specifically;

FIG. 2A shows the input signal;

FIG. 2B shows the voltage on the capacitor of the first stage;

FIG. 2C shows the output of the comparator in the first stage;

FIG. 2D shows the voltage on the capacitor in the second stage (also the peak detected output of the circuit);

FIG. 2E shows the output of the comparator in the second stage; and

Figure 2:
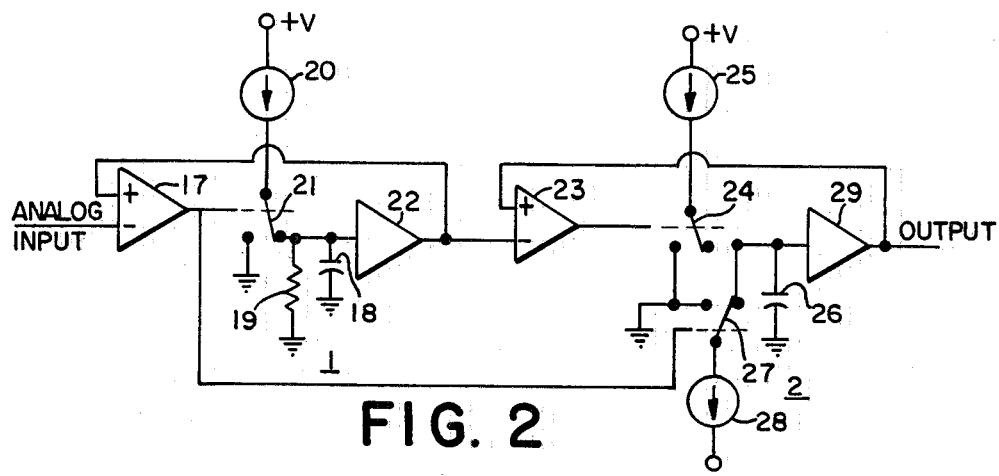
FIG. 2 shows the peak detector circuit of the present invention.

FIGS. 3A–D together show one specific embodiment of the invention in an AGC circuit for a magnetic disk drive head output.

DESCRIPTION OF THE PREFERRED EMBODIMENT

FIG. 1 is a functional diagram of a prior art peak detector circuit. The input signal, shown in FIG. 1A, is applied to the − input of comparator 11. Initially, the input signal is greater than the signal applied to the + input of comparator 11. The output of comparator 11 (FIG. 1C) is low during this time interval ($\Delta t = 1$) and the switch 12 connects the current source 13 to capacitor 14. Capacitor 14 stores the charge causing the voltage on capacitor 14 to increase as the analog input signal (FIG. 1A) increases. This charging process continues until the voltage across capacitor 14 exceeds the analog input signal ($\Delta t = 2$).

The output of buffer 15 tracks the voltage on the capacitor 14. The + input to the comparator 11 now exceeds the analog input signal and the comparator 11 output goes high, changing the position of switch 12 and shunting current source 13 to ground. The charge on the capacitor 14 now discharges through resistor 16 exponentially. The RC time constant establishes the peak detector bandwidth. This charge and discharge sequence repeats for each peak data as shown in the timing diagram.

The output of buffer 15 is the peak detector output which is usually filtered to produce an average DC output shown in FIG. 1D. The average DC output will vary as the peak data rate varies because of the varying discharge time for the RC circuit. Where there is a short time interval between peak pulses ($\Delta t=3$) the average DC output voltage is greater than the long time interval between peak pulses ($\Delta t=4$) average DC output voltage. This difference in average DC output voltage versus peak pulse period is a difference in gain versus peak pulse period. This difference in gain as a function of frequency, or the run length of the pulses, is undesirable.

FIG. 2 shows the peak detector circuit of the present invention which avoids the foregoing problems. It includes a first stage 1 which has a relatively short time constant for tracking the input signal with a high bandwidth. The second stage 2 has a relatively long time constant. It follows peaks as detected by the first stage and it is rapidly discharged during a brief interval when the first stage detects a new peak.

The first stage 1 includes a first comparator 17, a first capacitor 18 and discharge resistor 19, and a first current source 20. Switch 21 is operated by the comparator 17 to connect current source 20 to the capacitor 18 to charge to the peak of the input signal. Capacitor 18 is discharged through discharge resistor 19 with a relatively short time constant. The voltage on capacitor 18 is applied to a buffer 22, the output of which is applied to the + input of comparator 17 and it is applied to the input of second stage 2.

Second stage 2 includes a second comparator 23, a second switch 24, a second current source 25, and second capacitor 26. The comparator 23 controls switch 24 to connect current source 25 to the capacitor 26 to charge it to the peak value as sensed by the first stage. Capacitor 26 has a discharge path with a relatively long time constant. To make it track the first stage accurately, capacitor 26 is discharged when a new peak is detected by the first stage. Comparator 17 in the first stage controls a switch 27 which connects a current source 28 to the capacitor 26 to discharge it when a new peak in the input voltage is being detected.

The operation of the circuit of FIG. 2 will be better understood from the following which refers to the waveforms of FIGS. 2A-E.

The input signal applied to comparator 17 is initially greater than the signal on the + input to the comparator 17. The output of comparator 17 is low during time zero to one and switch 21 connects current source 20 to capacitor 18. Capacitor 18 stores the charge from current source 20, causing the voltage on capacitor 18 (FIG. 2B) to increase as the analog input voltage increases. This charging process continues until the voltage across capacitor 18 exceeds the analog input voltage, time reference $t=1$. The output of buffer 22 tracks the voltage on capacitor 18. The + input to comparator 17 now exceeds the input signal (FIG. 2A) and the comparator output (FIG. 2C) goes high changing switch 21 to a position shunting current source 20 to ground. The charge on capacitor 18 now discharges through resistor 19 exponentially. The RC time constant establishes the discharge rate and the peak detector bandwidth.

The input to the second stage is the output of the first stage. The input to the second comparator 23 is greater than the + input (FIG. 2D). The output of comparator 23 is low, causing switch 24 to be in the position shown. Switch 24 directs the current from second current source 25 to capacitor 26.

Figure 2A:
Figure 2B:
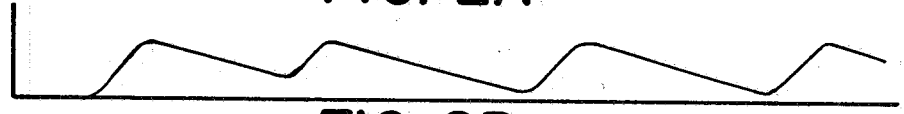
Figure 2C:
Figure 2E:
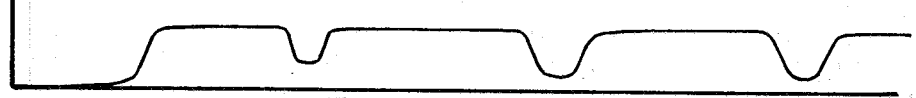
Figure 2F:
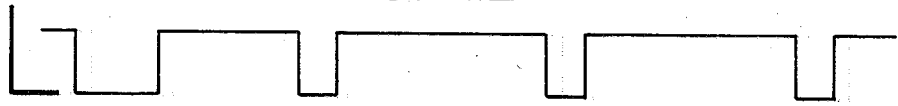

Comparator 17 in stage 1 controls switch 27 in stage 2. When the output of comparator 17 is low, switch 27 is in the position shown and third current source 28 rapidly removes charge from capacitor 26. After the output of comparator 17 (FIG. 2C) goes high and switch 27 shunts current source 28 to ground, the current source 25 charges capacitor 26 to a voltage that exceeds the input signal (FIG. 2A). The output of comparator 23 goes high. Switch 24 changes position, shunting current source 25 to ground. The charge on capacitor 26 remains at a fixed level until the output of comparator goes low, then it is rapidly discharged and the operation repeats.

The bandwidth of the peak detector is established by the time constant of capacitor 18 and resistor 19. This time constant determines the ability of the peak detector to track AM modulation. The second stage output is held at the first stage peak value until another peak is seen by the first stage. At that time, the second stage is rapidly discharged and the new peak value is held. This non-varying output between peaks keeps the peak detector at a constant output versus carrier frequency which means that the peak detector gain does not appreciably change with a change in carrier frequency.

Figure 3B:
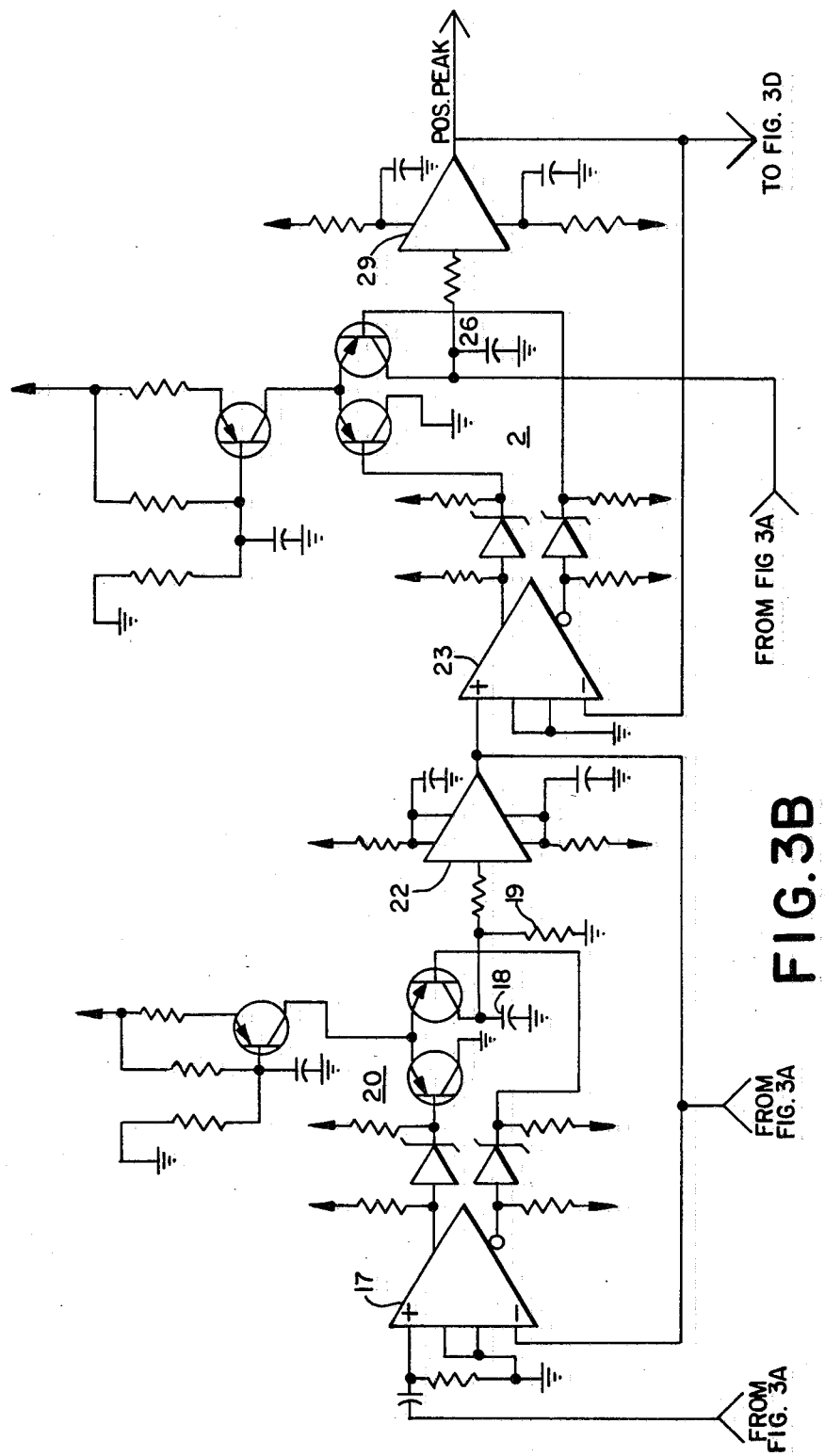
Figure 3C:
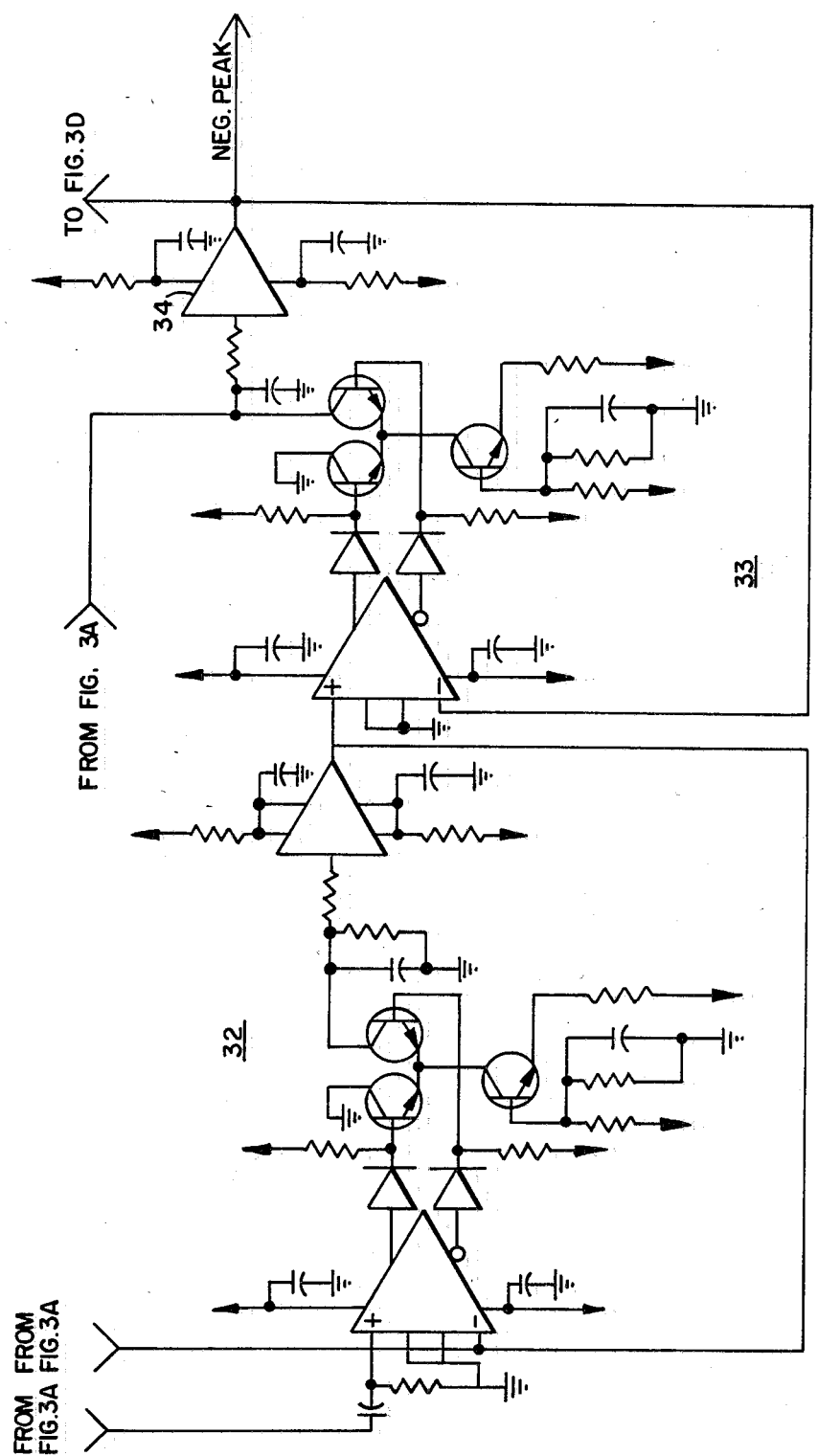
Figure 3D:
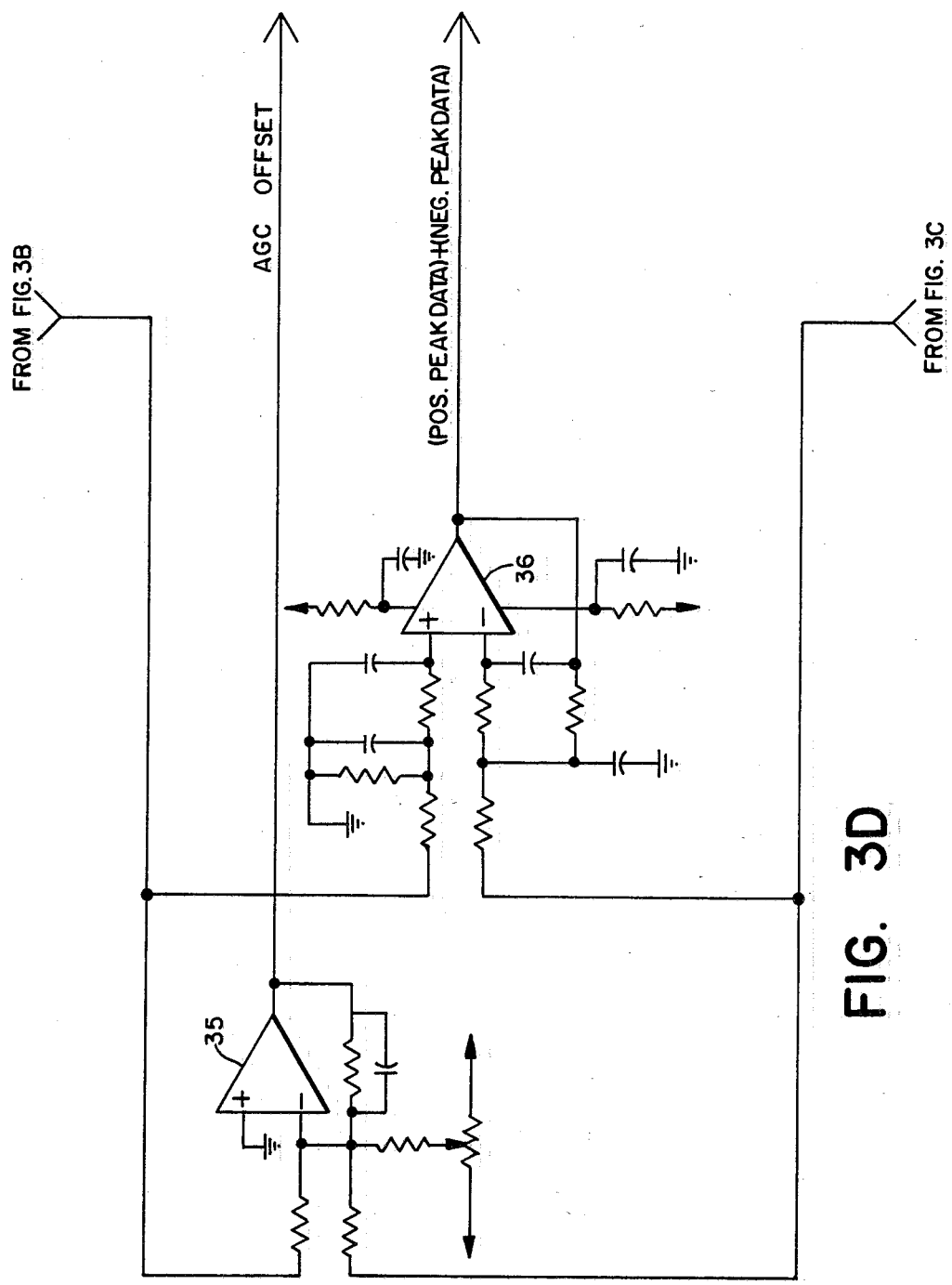

FIGS. 3A-3C show an exemplary embodiment of the invention in a circuit for producing an AGC signal from the input signal from a magnetic disk head. Like reference numerals denote like components in FIG. 2. The first stage 1 and second stage 2 of the FIG. 3 circuit are similar to FIG. 2, except that another comparator 31 has been added to sense the input signal and to control switch 27 which connects current source 28 to capacitor 26 in the second stage to discharge it rapidly when a new peak in the input signal is being detected.

The circuit including stage 1 and stage 2 detects the positive peaks in the input signal and produces a positive peak output from the buffer 29.

Another circuit just like the one previously described is used to detect negative peaks in the input signal. First stage 32 and second stage 33 are similar to the first and second stages 1 and 2.

The positive peak voltage, from buffer 29, and the negative peak voltage, from buffer 34, are summed in the summing circuit which includes amplifier 35 to produce a voltage which is used as the offset error signal. The positive peak voltage and negative peak voltage are combined in the circuit which includes amplifier 36 to produce a signal representing the sum of the absolute values of the positive and negative peaks. This signal represents the total excursion, peak to peak, of the input signal and is the amplitude signal for AGC feedback.

While a particular embodiment of the invention has been shown and described, various modifications are within the true spirit and scope of the invention. The appended claims are, therefore, intended to cover all such modifications.

What is claimed is:

1. A peak detector circuit comprising:
   a first current source;
   a first capacitor and discharge resistor;

a first comparator, said input signal being applied to one input, the voltage on said capacitor being connected to the other input, said comparator connecting said first current source to said capacitor when said input signal exceeds the voltage on said first capacitor to charge it to each peak voltage of said input signal, said capacitor being discharged through said resistor with a relatively short time constant when current source is disconnected from said first capacitor;

a second current source;

a second capacitor with a relatively long time constant discharge path;

a second comparator, the voltage on said first capacitor being applied to one input of said second comparator, the voltage on second capacitor being applied to the other input of said second comparator, said second comparator connecting said second current source to said second comparator to charge said second comparator to each peak voltage on said first capacitor; and a third current source, said first comparator connecting said third current source to said second capacitor to rapidly discharge during times when said input signal exceeds the voltage on said first capacitor.

2. The peak detector circuit recited in claim 1 further comprising:

a switch controlled by said second comparator, said second current source being applied to said second capacitor through said switch when the voltage on said first capacitor exceeds the voltage on said second capacitor to charge said second capacitor to the voltage on said first capacitor.

3. The peak detector circuit recited in claim 2 further comprising:

another switch controlled by said first comparator, said other switch connecting said third current source to said second capacitor to discharge it rapidly when said input signal exceeds the voltage on said first comparator.

4. The peak detector circuit recited in claim 1 further comprising:

a first switch between said first current source and first capacitor, said first comparator operating said first switch to apply said first current source to said first capacitor when said input signal exceeds the voltage on said first capacitor.

5. The peak detector circuit recited in claim 1 further comprising:

first and second buffer amplifier respectively connected between said first and second capacitors and the other input of said first and second comparators.

6. The peak detector circuit recited in claim 1 wherein said input signal is the read back analog signal from a disk drive head and wherein one peak detector circuit as recited in claim 1 detects peaks of one polarity in said input signal and another peak detector circuit as recited in claim 1 detects peaks of opposite polarity.

7. The peak detector circuits recited in claim 6 further comprising:

a summing circuit for adding the absolute values of the detected peaks of both polarities to form an AGC signal for said disk drive.

* * * * *